INVENTOR
IRA MARVIN WEILERSTEIN
BY G. Donald Weber Jr.
ATTORNEY 3,399,357
WIDEBAND TRANSISTOR AMPLIFIER WITH OUTPUT STAGE IN THE FEEDBACK LOOP Ira Marvin Weilerstein, Philadelphia, Pa., assignor to Sperry Rand Corporation, New York, N.Y., a corporation of Delaware
Filed Aug. 26, 1965, Ser. No. 482,784
2 Claims. (Cl. 330—22)

ABSTRACT OF THE DISCLOSURE

This invention relates to a wideband differential amplifier whose output stage is in the feedback loop. The circuit comprises three pairs of transistors which provide voltage and power amplification of the differential input signal, $V_A - V_B$ and rejection of the common mode input signal, $$\frac{V_A + V_B}{2}$$

The first and second amplifier stages Q1 and Q2 provide voltage gain and common mode rejection. The third or output stage Q3 gives power gain and provides a low impedance output since it is connected as an emitter follower. The low output impedance is desirable in a wideband amplifier to avoid deterioration of the output signal bandwidth due to load or wiring capacitance.

This invention relates to a transistor amplifier circuit. More particularly, the invention relates to a transistor amplifier circuit which includes a feedback loop in the output stage and exhibits wideband operation.

There are a great number of transistor amplifier circuits which are known in the art. However, each of these circuits has certain disadvantages in certain applications. The instant circuit is provided for utilization in an environment wherein extremely small signals must be amplified while preserving the high speed operation of the input circuitry. In addition, low power requirements and a high signal-to-noise ratio for the circuit are desirable. Thus, it is shown that a plurality of amplifier stages may be cascaded in order to produce a large overall amplification of the input signal. In addition, a feedback stage is utilized wherein the feedback stage is also the output stage. This arrangement of the circuit is advantageous relative to the more typical transistor amplifier circuit known in the art wherein an impedance feedback network is provided and a separate output stage is utilized. In addition, in certain environmental uses of the circuit, a pair of amplifier circuits may be utilized in parallel to perform the operation of a differential amplifier.

Consequently, it is obvious that one object of this invention is to provide a transistor amplifier with large bandwidth operation.

Another object of this invention is to provide a transistor amplifier wherein large bandwidth operation is provided by incorporating a transistor in the feedback loop.

Another object of this invention is to provide a transistor amplifier wherein the output transistor in the feedback loop provides a low output impedance.

Another obejct of this invention is to provide a transistor amplifier wherein the output stage and the input stage share bias current in order to reduce the power dissipation.

These and other objects and advantages of this invention will become more readily apparent when the following description is read in conjunction with the drawings, in which.

Figures 1, 2:
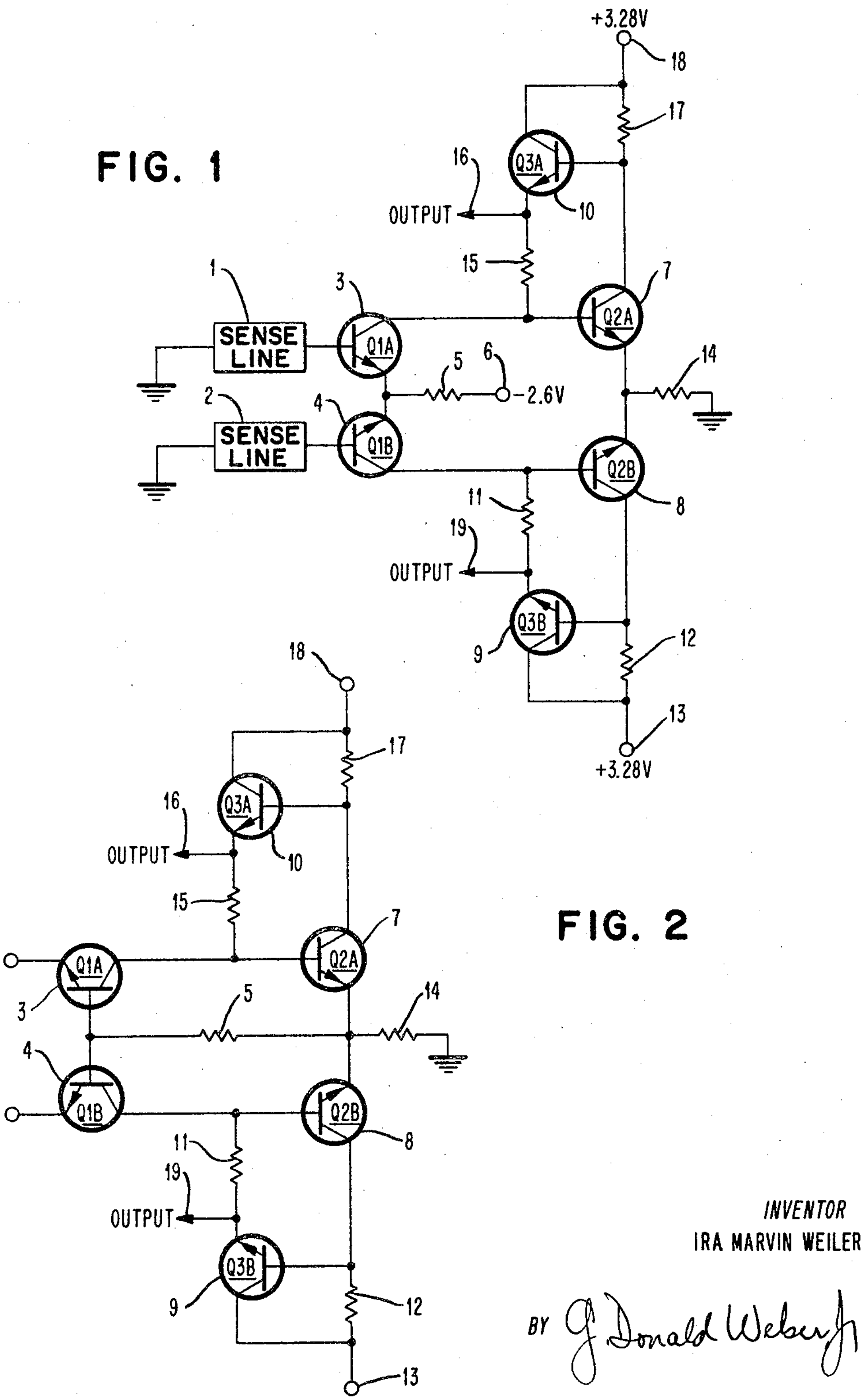
FIGURE 1 is a schematic diagram of one embodiment of the invention, shown in the form of a common emitter differential amplifier.
FIGURE 2 is a schematic diagram of another embodiment of the invention, shown as a common-base differential amplifier.
Figure 3:
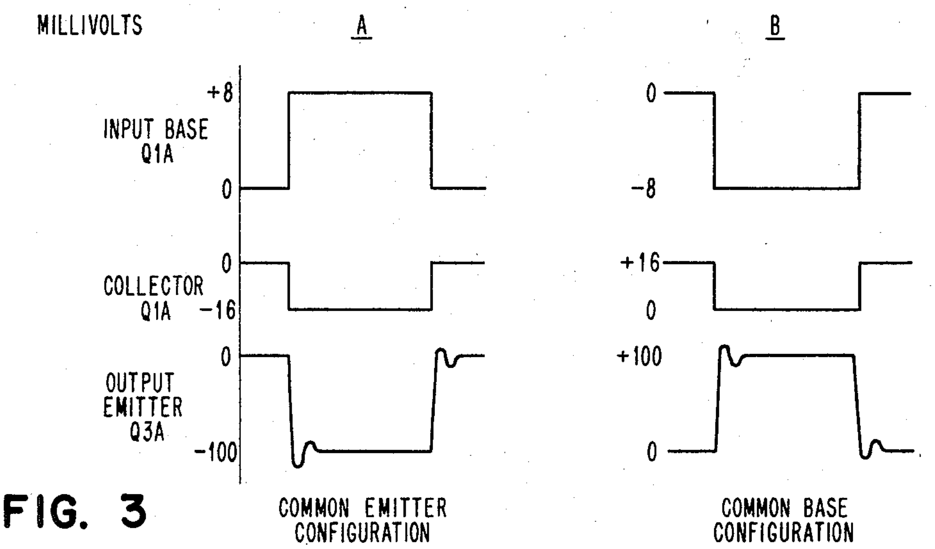
Figure 4:
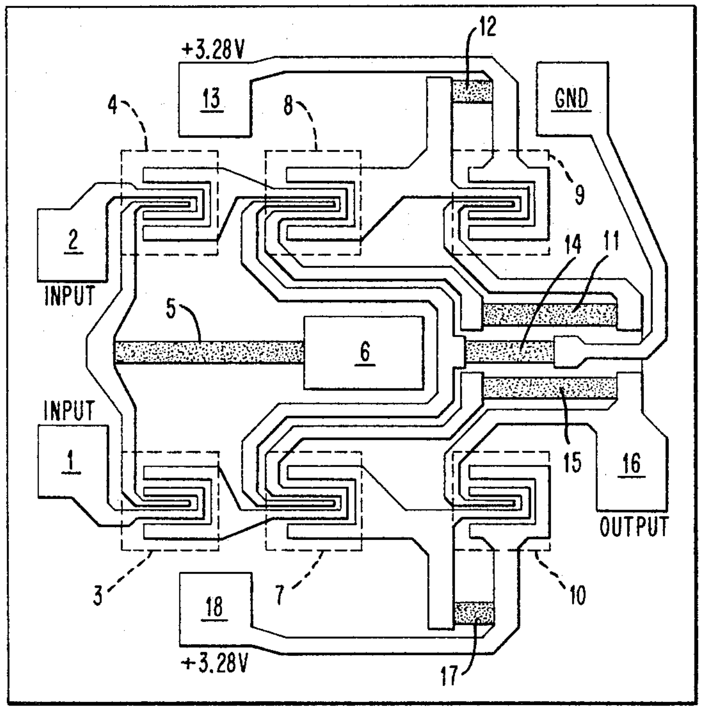

FIGURE 3, A and B are graphic diagrams of waveforms produced in and by the circuits shown in FIGURES 1 and 2 respectively; and FIGURE 4 is a diagram of one layout of the common-emitter differential amplifier in integrated circuit form.

Referring to FIGURE 1, there is shown a schematic diagram of the instant circuit utilized as a differential amplifier with a common-emitter configuration. In the environment shown relative to FIGURE 1, it is assumed that the differential amplifier is utilized to detect the signals supplied by a thin magnetic film memory or the like. Thus, the sense line pair, including sense lines 1 and 2 represents the input lines to the circuit and which are associated with the thin magnetic films. One of the lines, for example sense line 1, may represent the actual output line while line 2, for example, may represent a dummy line or load in the magnetic system. The utilization of an actual output line and a dummy line is well known in the art and is utilized to minimize noise and other spurious signals.

The sense lines 1 and 2 are connected to the base electrodes of transistors 3 and 4, respectively. The emitters of transistors 3 and 4 are connected together at one terminal of resistor 5, which may be on the order of 950 ohms. Another terminal of resistor 5 is connected to source 6 which may be a typical constant voltage source capable of supplying a potential of about —2.6 volts. The collector electrodes of transistors 3 and 4 are connected to the base electrodes of transistors 7 and 8 respectively as well as to resistors 15 and 11, respectively. The emitter electrodes of transistors 7 and 8 are connected together at one terminal of resistor 14 which may be on the order of 475 ohms. Another terminal of resistor 14 is connected to a suitable reference potential, for example, ground. The collector electrodes of transistors 7 and 8 are connected to the base electrodes of transistors 10 and 9 respectively as well as to one terminal of resistors 17 and 12 respectively. Another terminal of each of resistors 17 and 12 is connected to potential sources 13 and 18 respectively. Sources 13 and 18 are standard sources which are capable of supplying a substantially constant potential of approximately +3.28 volts. The collector electrodes of transistors 9 and 10 are also connected to the +3.28 volt sources. The sources 13 and 18 may actually be a single voltage source. The emitter electrode of transistor 9 is connected to another terminal of resistor 11 as well as to output terminal 19. The emitter electrode of transistor 10 is connected to another terminal of resistor 15 as well as to output terminal 16. Resistors 11 and 15 may be on the order of 680 ohms in the embodiment shown. The connection of the output feedback stage transistors 9 and 10 permits the sharing of bias current with the input stage transistors 3 and 4. Thus, the power dissipation is greatly reduced over other feedback schemes.

It should be noted, that all of the transistors shown and described in the schematic diagram shown in FIGURE 1 are preferably high speed NPN transistors which produce high gain with low collector current. In addition, the $r_b'$ impedance of the transistors is desired to be extremely low in order to avoid excessive noise problems.

The operation of the circuit shown in FIGURE 1 is more readily understood when concurrent reference is made to the waveforms shown in FIGURE 3A. It is assumed that a positive going signal on the order of approximately 8 millivolts is supplied at the base of transistor 3 via sense line 1. Since the sense of the input signal applied to the base of transistor 3 is relative to the signal applied at the base of transistor 4 in a differential amplifier, opposite phenomena occur at the different transistors. Thus, with the application of a relatively positive signal to the base of transistor 3 and a relatively negative signal to the base of transistor 4, transistor 3 begins to turn on and conduct more current therethrough. Conversely, transistor 4 begins to turn off slightly and conduct less current therethrough. Thus, all of the transistors in the circuit shown in FIGURE 1 are considered to be in the conductive condition. These transistors are not driven to saturation or are they driven to turn off in the normal operation of the circuit. Rather, when the transistor is turned on more current flows therethrough and when the transistor is turned off less current flows therethrough.

More particularly, since transistor 3 has been described as being turned on by a positive going signal to base thereof, current flows from the collector to the emitter electrode in the standard fashion and thence to source 6 via resistor 5. It is easily seen, that the potential at the collector electrode of transistor 3 will be relatively negative going inasmuch as source 6 is a negative potential source. The negative going signal at the collector of transistor 3 is applied to the base of transistor 7. The negative going signal at the base thereof, begins to turn transistor 7 off. Thus, less current flows from the collector to the emitter electrode of transistor 7.

Conversely, since transistor 4 has been turned slightly off by the application of a negative going signal to the base thereof, less current flows therethrough. Consequently, the potential at the collector of transistor 4 is a relatively positive going signal. This relatively positive going signal is applied to the base of transistor 8. The positive going signal applied at the base thereof, turns transistor 8 on to a greater extent whereby a larger current flows from the collector to the emitter electrode thereof.

It should be noted, that in the initial or quiescent stage, transistors 3 and 4 as well as transistors 7 and 8 are arranged in substantially balanced transistor pairs. Thus, a quiescent current of approximately 2 milliamperes is designed to flow in resistor 5 to source (or sink) 6. This 2 milliampere current is supplied equally (i.e. 1 milliampere each) via transistors 3 and 4. Similarly, a two milliampere current exists in resistor 14. This 2 milliampere current is applied equally (i.e. 1 milliampere each) via transistors 7 and 8. Thus, when either of the transistors of the pair is turned slightly on or off by the application of an input signal, the opposite reaction occurs at the other transistor in the pair whereby the 2 milliampere current is substantially maintained in the load resistor. For example, with the application of the positive going signal to the base of transistor 3, transistor 3 turns on and conducts a greater amount of current. Conversely, transistor 4 turns off slightly and conducts a slightly lower amount of current. The same operational characteristic exists for transistors 7 and 8.

In the illustrative example of operation, when transistor 7 is turned slightly off by the signal applied at the base thereof from the collector electrode of resistor 3, a smaller current flows therethrough. Consequently, load resistor 17 in the second stage produces a smaller voltage drop thereacross than was the case in the quiescent condition. In other words, a relatively more positive signal is applied at the base of transistor 10. The relatively more positive signal at the base of transistor 10, turns this transistor slightly on whereby a greater current is conducted therethrough. Consequently, a greater voltage drop exists across resistor 15. This greater voltage drop across resistor 15 is reflected as a positive going signal at output terminal 16.

The converse operation occurs relative to transistor 9. That is, transistor 8 is turned on by the positive going signal applied to the base thereof from the collector electrode of transistor 4 whereby a greater current exists in resistor 12. This greater current produces a greater potential across resistor 12 whereby a relatively negative going signal is applied to the base of transistor 9. A relatively negative signal at the base of transistor 9 causes this transistor to turn off slightly whereby less current flow exists therethrough and through resistor 11. The smaller current flows through resistor 11 produces a smaller voltage drop thereacross which is reflected as a relatively negative going signal at output terminal 19.

This circuit provides increased bandwidth characteristics thereby producing shorter rise and fall times for the signals. The improved bandwidth is due, in part at least, to the high input impedance at transistors 9 and 10 and the low output impedance of the circuit. These conditions permit the circuit to operate almost independently of the load impedance.

Referring now to FIGURE 2, there is shown a further embodiment of the instant invention. The embodiment shown in FIGURE 2 is substantially similar to the embodiment shown in FIGURE 1 with the exception that the input transistors are connected in a common base input stage configuration rather than in the common emitter configuration. In FIGURES 1 and 2, similar components bear similar reference numerals. Certain minor modifications are required in this arrangement. For example, sink 6 is eliminated. In addition, the values of certain of the resistors as well as the values of the potential sources may be varied somewhat. However, the operation of the circuit shown in FIGURE 2 is substantially identical to the operation of the circuit shown in FIGURE 1 with the exception that the input signals are applied at the emitter electrodes rather than the base electrodes. Of course, the changes in the configuration of the circuit produce and/or require modifications in the signals applied and produced by the circuit. However, for the most part the changes in the signals are in the nature of polarity only.

The signals produced by and/or applied to the circuits of FIGURES 1 and 2 are, shown in FIGURES 3*a* and 3*b* respectively. These signals are shown in substantially idealized form. However, it is to be understood that because of the inherent delays (on the order of fractional nanoseconds) in the transistors themselves, as well as in the interstage coupling, the leading edge of the signal detected at the collector of transistor Q1*a* is slightly delayed relative to the leading edge of the input signal supplied to the base of transistor Q1*a*. Similarly, the output signal detected at the emitter electrode of transistor Q3*a* is again delayed with respect to the signal at the collector electrode of transistor Q1*a*. Although it is not a problem, certain parasitic phenomena, such as overshoot and ringing, are represented at the leading and trailing edges of the output signal. Of course, through proper damping and the like, these parasitic phenomena may be removed if desired.

Referring to FIGURE 4, there is shown a layout for the instant circuit in the integrated circuit form. Although the instant circuit is not to be limited thereto, it lends itself easily to the integrated circuit form. The form shown in FIGURE 4 is the integrated circuit layout for the common emitter configuration as shown in FIGURE 1. Similar elements in FIGURE 4 bear similar reference to those utilized in FIGURE 1.

From the foregoing description, it will be understood that various changes may be made in the form, construction and arrangement of the parts, without departing from the scope of the invention, the form hereinbefore described being merely a preferred embodiment.

The embodiments of the invention in which an exclusive property or privilege is claimed are defined as follows:

1. A different amplifier comprising first, second and third pairs of NPN transistors each having a base, emitter, and collector electrodes, input means connected to said respective base electrodes of said first pair of transistors, said first pair of transistors conducting current in balance through the respective emitters, which are connected to one another, a voltage source, a first resistor, said emitters being connected to said voltage source through said first resistor, the respective collectors of said first pair of transistors connected to the base elements of said second pair of transistors, the emitters of said second pair of transistors being connected to one another and are terminated to ground potential through a second resistor, said second transistor pair conducting current in balance, the respective collectors of said second pair of transistors connected to said base electrodes of said third pair of transistors, first and second output resistors, said respective emitters of said third pair of transistors connected to said respective collector electrodes of said first pair of transistors via said first and second output resistors, said respective collector electrodes of said second pair of transistors connected to voltage means, third and fourth resistor means, said base electrodes of said second pair of transistors connected via said third and fourth resistor means to said voltage means, respective output means connected between said first and second output resistors and the emitters of said third pair of transistors.

2. A difference amplifier comprising first, second and third pairs of NPN transistors each having a base, emitter and collector electrode, input means connected to said respective emitter electrodes of said first pair of transistors, said base electrodes being connected to one another, a first resistor one terminal of which is connected to said common base connection, the respective collectors of said first pair of transistors being connected to the base elements of said second pair of transistors, the emitters of said second pair of transistors and said second terminal of said first resistor being common connected, a second resistor, one terminal being connected to the connection between said emitters of said second pair of transistors and the other terminal of said second resistor being connected to ground, the respective collectors of said second pair of transistors connected to said base electrodes of said third pair of transistors, first and second output resistors, said respective emitters of said third pair of transistors connected to said respective collector electrodes of said first pair of transistors via said first and second output resistors, said respective collector electrodes of said second pair of transistors connected to voltage means, third and fourth resistor means, said base electrodes of said second pair of transistors connected via said third and fourth resistor means to said voltage means, respective output means connected between said first and second output resistors and the emitters of said third pair of transistors.

References Cited

UNITED STATES PATENTS

| | | | |
|---|---|---|---|
| 2,810,025 | 10/1957 | Clements | 330—85 X |
| 3,003,113 | 10/1961 | MacNichol | 330—69 |
| 3,287,653 | 11/1966 | Gooadman | 330—25 X |

ROY LAKE, *Primary Examiner.*

J. B. MULLINS, *Assistant Examiner.*